United States Patent
Kato et al.

(10) Patent No.: US 11,319,412 B2
(45) Date of Patent: May 3, 2022

(54) THERMALLY CONDUCTIVE SILICONE COMPOUND

(71) Applicant: DOW TORAY CO., LTD., Tokyo (JP)

(72) Inventors: Tomoko Kato, Ichihara (JP); Toyohiko Fujisawa, Ichihara (JP); Harumi Kodama, Ichihara (JP); Masayuki Onishi, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 0 days.

(21) Appl. No.: 16/345,704

(22) PCT Filed: Oct. 5, 2017

(86) PCT No.: PCT/JP2017/036214
§ 371 (c)(1),
(2) Date: Apr. 27, 2019

(87) PCT Pub. No.: WO2018/079215
PCT Pub. Date: May 3, 2018

(65) Prior Publication Data
US 2019/0345291 A1 Nov. 14, 2019

(30) Foreign Application Priority Data

Oct. 31, 2016 (JP) .............................. JP2016-213176

(51) Int. Cl.
*C08G 77/12* (2006.01)
*C08K 3/013* (2018.01)
*C08G 77/08* (2006.01)
*C08G 77/20* (2006.01)
*H01L 23/373* (2006.01)

(52) U.S. Cl.
CPC ............ *C08G 77/12* (2013.01); *C08G 77/08* (2013.01); *C08G 77/20* (2013.01); *C08K 3/013* (2018.01); *C08K 2201/001* (2013.01); *C08K 2201/003* (2013.01); *H01L 23/373* (2013.01)

(58) Field of Classification Search
CPC ........ C08G 77/08; C08G 77/12; C08G 77/16; C08G 77/18; C08G 77/20; C08L 83/04; B01J 23/42; C07F 7/1804; C07F 7/1896; C09D 183/04; C09J 183/04; C08K 3/36; C08K 3/013; C08K 2201/001; H01L 23/373
See application file for complete search history.

(56) References Cited

U.S. PATENT DOCUMENTS 5,017,654 A * 5/1991 Togashi .................. C08K 9/10
525/100
5,153,160 A * 10/1992 Saruyama ................ C08J 3/122
502/159
6,040,362 A * 3/2000 Mine ........................ C08K 9/02
523/200

| | | |
|---|---|---|
| 2003/0049466 A1 | 3/2003 | Yamada et al. |
| 2004/0176517 A1 | 9/2004 | Hatanaka et al. |
| 2005/0239940 A1 | 10/2005 | Shima et al. |
| 2006/0047043 A1 | 3/2006 | Nakayoshi et al. |
| 2007/0149834 A1 | 6/2007 | Endo et al. |
| 2007/0246245 A1 | 10/2007 | Ahn et al. |
| 2008/0254247 A1 | 10/2008 | Asaine |
| 2011/0024675 A1 | 2/2011 | Endo et al. |
| 2011/0248211 A1 | 10/2011 | Matsumoto et al. |
| 2012/0119137 A1 | 5/2012 | Tsuji et al. |
| 2014/0024796 A1 | 1/2014 | Mizunashi et al. |
| 2015/0148273 A1 | 5/2015 | Matsumoto et al. |
| 2015/0361320 A1 | 12/2015 | Tang et al. |
| 2017/0260392 A1 | 9/2017 | Kitazawa et al. |

FOREIGN PATENT DOCUMENTS

| | | |
|---|---|---|
| CN | 102533214 A | 7/2012 |
| EP | 0750008 A2 | 5/1996 |
| EP | 0939115 A1 | 9/1999 |
| JP | H08319425 A | 12/1996 |
| JP | 2938428 B1 | 8/1999 |

(Continued)

OTHER PUBLICATIONS

Freeman (Silicones, Published For The Plastics Institute, ILIFFE Books, Ltd., 1962, p. 27).*
English translation of International Search Report for International Application No. PCT/JP2017/036214 dated Jan. 9, 2018, 3 pages.
Machine assisted English translation of JP2938428B1 obtained from https://patents.google.com on Apr. 26, 2019, 11 pages.
Machine assisted English translation of JP2938429B1 obtained from https://patents.google.com on Apr. 26, 2019, 11 pages.

(Continued)

*Primary Examiner* — Kuo Liang Peng

(74) *Attorney, Agent, or Firm* — Warner Norcross + Judd LLP

(57) ABSTRACT

A single-fluid curable thermally conductive silicone grease composition having long-term storage stability at room temperature is provided. The single-fluid curable thermally conductive silicone grease comprises: an organopolysiloxane, having an aliphatic unsaturated hydrocarbon group per single molecule, with a viscosity at 25° C. between 50 and 100,000 mPa·s; an organohydrogen siloxane that includes hydrogen atoms bonded to at least two silicon atoms per single molecule; a thermally conductive filler that includes particle diameters with an average particle diameter between 0.01 and 200 μm; a microparticle catalyst, with an average particle diameter of between 0.01 and 10 μm, comprising a thermoplastic resin with a softening point between 40° C. and 200° C., wherein a platinum-based catalyst is included at no less than 0.01 mass %, as platinum metal atoms; and a curing control agent. The complex modulus of elasticity after curing of the composition is between 0.01 MPa and 20 MPa at 25° C.

18 Claims, 2 Drawing Sheets

(56) References Cited

FOREIGN PATENT DOCUMENTS

| | | | |
|---|---|---|---|
| JP | 2938429 | B1 | 8/1999 |
| JP | 2003292781 | A | 10/2003 |
| JP | 3524634 | B2 | 5/2004 |
| JP | 2004168920 | A | 6/2004 |
| JP | 2004176165 | A | 6/2004 |
| JP | 3580366 | B2 | 10/2004 |
| JP | 3952184 | B2 | 8/2007 |
| JP | 4572243 | B2 | 8/2007 |
| JP | 2008518082 | A | 5/2008 |
| JP | 4656340 | B2 | 3/2011 |
| JP | 4913874 | B2 | 4/2012 |
| JP | 4917380 | B2 | 4/2012 |
| JP | 4933094 | B2 | 5/2012 |
| JP | 5233325 | B2 | 7/2013 |
| JP | 5283346 | B2 | 9/2013 |
| JP | 5365572 | B2 | 12/2013 |
| JP | 2014003152 | A | 1/2014 |
| JP | 5832983 | B2 | 12/2015 |
| JP | 2016098337 | A | 5/2016 |
| TW | 201420679 | A | 6/2014 |
| TW | 201434982 | A | 9/2014 |
| WO | 2004046233 | A1 | 6/2004 |
| WO | 2007032481 | A1 | 3/2009 |
| WO | 2013191116 | A1 | 12/2013 |

OTHER PUBLICATIONS

Machine assisted English translation of JP3952184B2 obtained from https://patents.google.com on Apr. 26, 2019, 9 pages.
Machine assisted English translation of JP4572243B2 obtained from https://patents.google.com on Apr. 26, 2019, 15 pages.
Machine assisted English translation of JP4656340B2 obtained from https://patents.google.com on Apr. 26, 2019, 10 pages.
Machine assisted English translation of JP4913874B2 obtained from https://patents.google.com on Apr. 26, 2019, 12 pages.
Machine assisted English translation of JP4917380B2 obtained from https://patents.google.com on Apr. 26, 2019, 8 pages.
Machine assisted English translation of JP3524634B2 obtained from https://patents.google.com on Apr. 26, 2019, 9 pages.
Machine assisted English translation of JP5832983B2 obtained from https://patents.google.com on Apr. 26, 2019, 11 pages.
Machine assisted English translation of JPWO2007032481 (A1) obtained from https://worldwide.espacenet.com on Apr. 29, 2019, 19 pages.

* cited by examiner

THERMALLY CONDUCTIVE SILICONE COMPOUND

CROSS-REFERENCE TO RELATED APPLICATIONS

This application is the National Stage of International Application No. PCT/JP2017/036214 filed on 5 Oct. 2017, which claims priority to and all advantages of Japanese Patent Appl. No. 2016-213176 filed on 31 Oct. 2016, the content of which is hereby incorporated by reference.

FIELD OF TECHNOLOGY

The present invention relates to a single-fluid curable thermally conductive silicone grease composition, a method for coating the composition, and an electronic device using the same.

PRIOR ART

Printed circuit boards and hybrid ICs wherein electronic components, such as transistors, ICs, memory elements, and the like, are mounted, are packaged in order to provide protection from the external environment, to make metal connections, and to dissipate heat. With higher densities and higher levels of integration of mounted semiconductors, thermally conductive silicone rubber compositions, thermally conductive silicone gel compositions, thermally conductive silicone grease compositions, single-fluid curable thermally conductive silicone grease compositions, and the like, have been developed and have come to be used in order to dissipate heat efficiently (Patent Documents 1-12). This has made it possible to handle stringent heat dissipation requirements.

Heat dissipating sheets, and the like, that use thermally conductive silicone rubber compositions are also used as countermeasures for heat in semiconductor packages (Patent Document 12). However, as described in this document, with a silicone rubber composition, the density of cross-links is high, and thus when there is an incline or topology in the surface that contacts the heat generating member, a gap is produced between the silicone rubber composition and the heat generating member, which has a negative effect on the heat dissipation performance. Because of this, in applications wherein heat is dissipated from heat generating members such as these, heat dissipating grease that is able to coat a surface thinly, conforming well to the surface, have been well suited from the perspectives of efficiency and stability in heat dissipation performance.

Heat dissipating greases can be divided broadly into non-curable types that maintain the form of a grease, without hardening, and curable types that can be hardened after being compressed to a desired thickness. Non-curable heat dissipating grease typically has the benefit of easy handling, such as enabling storage at room temperature. However, because in heat-generating portions in semiconductor packages there is expansion and contraction through the thermal history of heating and cooling, a non-curable heat dissipating grease will flow out (be pumped out) from the semiconductor package, producing a void, which is undesirable from the perspective of reliability.

On the other hand, with a curable heat dissipating grease, through hardening after deformation to the desired thickness, fundamentally there is less of a tendency for this pumping-out and production of voids. This enables an increase in the reliability of the semiconductor package. However, the use of a curable heat dissipating grease gives rise to other problems.

An additive-curable heat dissipating grease has been proposed as a thermal countermeasure for semiconductor packages (Patent Document 13). As additive-curable types there are single-fluid compositions and double-fluid compositions, but from the perspective of ease of operations, such as complexity in mixing, the single-fluid composition is preferred. However, with the single-fluid composition, frozen or refrigerated storage is required, making product control difficult. Moreover, when curing it is necessary to heat the electronic device for a given amount of time after coating, thus leading to a reduction in production efficiency through causing the process to be more complex and time-consuming. Moreover, there is also an issue with the increased load on the environment through the heating process. Moreover, even if heating were not necessary, the curing has been inadequate with coating thicknesses in excess of 2 mm.

Condensation curable heat dissipating greases have been developed in response to various issues such as these (Patent Documents 14, 15). The benefits of this type of heat dissipating grease is that it does not require a heating step, and that thickening and curing is through moisture in the air. However, the condensation curable heat dissipating grease is poor in terms of the ability to perform a rework, and there is a problem in that, during the curing reaction, a low boiling point desorption component is produced. Given this, there are problems with producing orders, and with contamination of the electronic components through the desorbed components. That is, despite the benefits that are produced through changing the curing mechanism, in reality this has produced a variety of new problems.

PRIOR ART REFERENCES

Patent Documents

Patent Document 1: Japanese Patent 2938428
Patent Document 2: Japanese Patent 2938429
Patent Document 3: Japanese Patent 3580366
Patent Document 4: Japanese Patent 3952184
Patent Document 5: Japanese Patent 4572243
Patent Document 6: Japanese Patent 4656340
Patent Document 7: Japanese Patent 4913874
Patent Document 8: Japanese Patent 4917380
Patent Document 9: Japanese Patent 4933094
Patent Document 10: Japanese Patent 5283346
Patent Document 11: Japanese Patent 5233325
Patent Document 12: Japanese Patent 3524634
Patent Document 13: Japanese Patent 5832983
Patent Document 14: Japanese Patent 5365572
Patent Document 15: Japanese Unexamined Patent Application Publication 2016-98337

SUMMARY OF THE INVENTION

Problem Solved by the Present Invention

One object of the present invention is to provide a single-fluid curable thermally conductive silicone grease composition having long-term storage stability at room temperature and which can be stored vertically in a harsh thermal environment. Additionally, an object of the present invention is to solve problems with the physical properties produced through the use of microparticle catalysts in a silicone grease composition. Moreover, an object of the present invention is an effective method for coating the composition. Furthermore, an object of the present invention is to provide an electronic device that has this composition.

Means for Solving the Problem

A single-fluid curable thermally conductive silicone grease composition that is one aspect of the present invention has the following characteristics:

A single-fluid curable thermally conductive silicone grease composition comprising:
(A) 100 parts by weight organopolysiloxane, having an aliphatic unsaturated hydrocarbon group bonded to at least one silicon atom per single molecule, with a viscosity at 25° C. between 50 and 100,000 mPa·s;
(B) between 0.1 and 50 parts by weight of an organohydrogen siloxane that includes hydrogen atoms bonded to at least two silicon atoms per single molecule;
(C) between 400 and 5,000 parts by weight of a thermally conductive filler that includes particle diameters with an average particle diameter between 0.01 and 200 μm;
(D) between 0.01 and 20 parts by weight of a microparticle catalyst, with an average particle diameter of between 0.01 and 10 μm, comprising a thermoplastic resin with a softening point between 40° C. and 200° C., wherein a platinum-based catalyst is included at no less than 0.01 mass %, as platinum metal atoms; and
(E) between 0.01 and 5 parts by weight of a curing control agent.
the complex modulus of elasticity after curing is between 0.01 MPa and 20 MPa at 25° C.

Moreover, a single-fluid curable thermally conductive silicone grease composition that is one aspect of the present invention has the following characteristics:

A single-fluid curable thermally conductive silicone grease composition comprising:
(A) 100 parts by weight organopolysiloxane, having an aliphatic unsaturated hydrocarbon group bonded to at least one silicon atom per single molecule, with a viscosity at 25° C. between 50 and 100,000 mPa·s;
(B) an organohydrogen siloxane wherein an organohydrogen siloxane that includes hydrogen atoms bonded to at least two silicon atoms per single molecule includes, on average per single molecule, no less than zero and less than 3 hydrogen atoms bonded to non-terminal silicon atoms, in an amount wherein the number of hydrogen atom groups bonded to silicon atoms in the (B) component divided by the number of aliphatic unsaturated hydrocarbon groups in the (A) component is between 0.2 and 3.0;
(C) between 400 and 5,000 parts by weight of a thermally conductive filler that includes particle diameters with an average particle diameter between 0.01 and 200 μm;
(D) between 0.01 and 20 parts by weight of a microparticle catalyst, with an average particle diameter of between 0.01 and 10 μm, comprising a thermoplastic resin with a softening point between 40° C. and 200° C., wherein a platinum-based catalyst is included at no less than 0.01 mass %, as platinum metal atoms; and
(E) between 0.01 and 5 parts by weight of a curing control agent.

Moreover, a manufacturing method for the single-fluid curable thermally conductive silicone grease that is one aspect of the present invention has the distinctive feature heating the composition to a temperature no less than the softening point of the (D) component.

A method for applying the thermally conductive silicone grease composition that is one aspect of the present invention has the distinctive feature of a single-fluid curable thermally conductive silicone grease composition being filled into a nozzle that is capable of discharging, and after some or all of the nozzle has been heated to a temperature of no less than the softening point of the (D) component, the single-fluid curable thermally conductive silicone grease composition is coated through discharging from the nozzle.

Moreover, a manufacturing method for a heat dissipating member that is one aspect of the present invention has, as a distinctive feature, the inclusion of the steps described above.

An electronic device that is one aspect of the present invention has, as its distinctive feature, the presence of the heat dissipating member described above.

Effects of the Invention

The single-fluid curable thermally conductive silicone grease composition according to the present invention has long-term storage stability at room temperature, and the ability to accommodate temperature changes in the external environment. This makes it possible to resist cracking, even in high thermal environments in excess of 80° C., for example, and possible to exhibit high heat dissipating functionality even as environments become even hotter. Moreover, the ease of operations is good, without slipping and falling out, or without liquid dripping, even in a vertical environment. Moreover, the coating method according the present invention enables simple and reliable control of the physical properties of the heat dissipating member, without requiring another cross-linking reaction (heat curing) step. The electronic device according to the present invention is able to exhibit stabilized heat dissipating performance, even in a harsh thermal environment.

FORMS FOR CARRYING OUT THE PRESENT INVENTION

The single-fluid curable thermally conductive silicone grease composition according to the present invention will be explained in detail.

A "grease composition" is one that has the physical properties of a grease after a cross-linking reaction (after curing), and in the present application, refers to that which has a complex modulus of elasticity specified at between 0.01 MPa and 20 MPa. Moreover, "curing" refers to the cross-linking reaction, and, as indicated by the substance after curing being a grease, despite the viscosity being increased, the physical properties are not necessarily "hard."

(A) Component

The (A) component is at organopolysiloxane having an aliphatic unsaturated hydrocarbon group bonded to at least one silicon atom in the molecule, with a viscosity of between 50 and 100,000 mPa·s at 25° C.

The aliphatic unsaturated hydrocarbon group that is bonded to the silicon atom in the organopolysiloxane preferably is a monofunctional hydrocarbon group having an aliphatic unsaturated bond with a carbon number between 2 and 8, and, in particular, a carbon number between 2 and 6, and more preferably is an alkenyl group, which may be, for example, an alkenyl group such as a vinyl group, an allyl group, a propenyl group, an isopropenyl group, a butenyl group. A vinyl group is particularly preferred. The aliphatic unsaturated hydrocarbon group may be bonded to a silicon atom at the molecular chain terminal, bonded to a silicon atom in the middle of the molecular chain, or bonded at both locations.

As organic groups other than aliphatic unsaturated hydrocarbon groups, bonded to the silicon atom in the organopolysiloxane, monofunctional hydrocarbon groups that do not include non-substituted or substituted aliphatic unsaturated bonds, with carbon numbers between 1 and 18, and particularly carbon numbers between 1 and 10, and, in particular, carbon numbers between 1 and 8, are preferred, and may be, for example, alkyl groups such as methyl groups, ethyl groups, propyl groups, isopropyl groups, butyl groups, isobutyl groups, tert-butyl groups, pentyl groups, neopentyl groups, hexyl groups, cyclohexyl groups, octyl groups, nonyl groups, decyl groups, and the like; aryl groups such as phenyl groups, tolyl groups, xylyl groups, naphthyl groups, and the like; aralkyl groups such as benzyl groups, phenyl ethyl groups, phenyl propyl groups, and the like, or substituents wherein some or all of the hydrogen atoms of these groups have been replaced with halogen atom such as fluorine, bromine, chlorine, and the like, or with cyano groups, or the like, such as, for example, chloromethyl groups, chloropropyl groups, bromoethyl groups, trifluoropropyl groups, cyanoethyl groups, and the like. Methyl groups are particularly preferred.

The aforementioned organopolysiloxane, at 25° C., has a viscosity between 50 and 100,000 mPa·s, and preferably in a range between 60 and 20,000 mPa·s, and, most preferably, between 100 and 5,000 mPa·s. This is because if the viscosity at 25° C. were less than the lower limit of the range described above, the physical characteristics would suffer, although the viscosity of the silicone composition produced would be less, while, on the other hand, if in excess of the upper limit of the range described above, there would be a tendency for a remarkably reduced ease of handling of the silicone composition produced.

For the organopolysiloxane, there is no particular limitation on the molecular structure insofar as it has the properties described above, and may be, for example, linear, branched, partial branched linear, partial cyclic linear, a resin, or the like. In particular, those having a linear structure in which the main shape is composed of repeating diorganosiloxane units, with both molecular chain terminals are blocked with triorganosiloxy groups are preferred. The organopolysiloxane having the linear structure may have a partial branched structure or a partial cyclic structure. The organopolysiloxane may be used in one type alone, or in a combination of two or more types.

(B) Component

The (B) component comprises an organohydrogen siloxane that includes hydrogen atoms bonded to at least two silicon atoms in the molecule. The hydrogen atoms that are bonded to the silicon atoms, which have the effect of the cross-linking agent in the composition, are at between 0.01 and 0.4 mass % in the molecule. The organic group that is bonded to the silicon atom in the (B) component may be, for example, a monofunctional hydrocarbon group that has no aliphatic unsaturated bond, such as an alkyl group, a cycloalkyl group, an aryl group, an aralkyl group, a halogenated alkyl group, or the like, and preferably is an alkyl group or aryl group, and, particularly preferably, a methyl group or a phenyl group. There is no particular limitation on the molecular structure of the (B) component, which may be linear, or partially branched linear, branched, cyclic, network, or dendritic, and preferably is linear. Moreover, there is no particular limitation on the viscosity of the (B) component at 25° C., but preferably it is in a range between 1 and 10,000 mPa·s.

The (B) component preferably includes, on average, no less than 0 and less than 3 hydrogen atoms bonded, to non-terminal silicon atoms per single molecule. This is because the cross-linking reaction would not progress, and it would not be possible to produce the desired complex modulus of elasticity or the other effects if there were three or more hydrogen atoms bonded to non-terminal silicon atoms. Moreover, as one aspect of the present invention, when, on average, the number of hydrogen atoms that are bonded to non-terminal silicon atoms in the (B) component is no less than zero and less than 1 per single molecule, preferably the (A) component will have an organopolysiloxane of a branched structure, a partial branched linear structure, a partial cyclic linear structure, or a resin structure. Moreover, as one aspect of the present invention, when, on average, the number of hydrogen atoms bonded to non-terminal silicon atoms in the (B) component is no less than 1 and less than 3 per single molecule, preferably the (A) component will have an organopolysiloxane of a branched structure, a partial branched linear structure, or a partial cyclic linear structure. Moreover, as one aspect of the present invention, if, on average, the number of hydrogen atoms that are bonded to non-terminal silicon atoms in the (B) component is no less than 2 and less than 3 per single molecule, then preferably the organohydrogen siloxane for structuring the (B) component has, on average, less than two hydrogen atoms bonded to terminal silicon atoms per single molecule.

As examples of the (B) component there are copolymers of dimethyl siloxane and methyl hydrogen siloxane blocked on both terminals of the molecular chain by trimethyl siloxy groups, copolymers of dimethyl siloxane and methyl hydrogen siloxane blocked on both terminals of the molecular chain with dimethyl hydrogen siloxy groups, dimethyl polysiloxane blocked on both terminals of the molecular chain by dimethyl hydrogen siloxy groups, methylphenyl polysiloxane blocked on both terminals of the molecular chain by dimethyl hydrogen siloxy groups, diphenyl polysiloxane blocked on both terminals of the molecular chain by dimethyl hydrogen siloxy groups, and mixtures of two or more types of these organopolysiloxanes.

In the present invention, preferably, in the (B) component, the number of hydrogen atoms bonded to silicon atoms per single molecule is within a range of between 0.01 and 0.4 mass %, preferably within a range of between 0.02 and 0.35, and particularly preferably in a range between 0.05 and 0.3. This is because if the inclusion proportion in the (B) component were less than the lower limit of the range set forth above, there would be a tendency for a remarkably poorer ease of handling the silicone composition produced, and if in excess of the upper limit of the range set forth above, there would be a tendency for the composition produced, when stored vertically for an extended period of time in a harsh thermal environment after coating, to slip and fall out.

The inclusion proportion of the (B) component is a value wherein the number of hydrogen atoms that are bonded to silicon atoms in the component are in a range of between 0.2 and 3.0 in respect to one alkenyl group in the (A) component, and preferably in a range between 0.3 and 2.5, and particularly preferably in a range between 0.4 and 2.2. This is because if the inclusion proportion of the (B) component were less than the lower limit of the range set forth above, the composition produced would tend to flow out (be pumped out) from the semiconductor package after coating, where, on the other hand, if in excess of the upper limit of the range set forth above, there would be a tendency for the composition produced to slip and fall out when stored vertically over an extended period of time, in a harsh thermal environment, after coating.

(C) Component

The thermally conductive filling agent that is the (C) component is a component for providing the composition with thermal conductivity. The (C) component may be, for example, a metal oxide such as aluminum oxide, zinc oxide, magnesium oxide, titanium oxide, beryllium oxide, or the like; a metal hydroxide such as aluminum hydroxide, magnesium hydroxide, or the like; a nitrogen compound such as aluminum nitride, silicon nitride, boron nitride, or the like; a carbon compound such as boron carbide, titanium carbide, silicon carbide, or the like; a graphite such as black lead or plumbago; a metal such as aluminum, copper, nickel, silver, or the like; or a mixture thereof. In particular, when there is the need for electrical insulation in the silicone composition produced, then, preferably, the (C) component is a metal oxide, a metal hydroxide, a nitrogen compound, a carbon compound, or a mixture thereof, and, more preferably, is one or more selections from a group comprising aluminum oxide, crystalline silica, zinc oxide, magnesium oxide, titanium oxide, beryllium oxide, aluminum hydroxide, and magnesium hydroxide.

There is no particular limitation on the shape of the (C) component, which may be, for example, spherical, acicular, flake-shaped, or irregularly shaped. In particular, when aluminum oxide or crystalline silica is used as the (C) component, preferably that which is spherical or that which has an irregular shape is used. The spherical aluminum oxide is α-alumina produced primarily through a high temperature thermal spraying method or through a hydrothermal process. Here "spherical" refers not only to that which is perfectly spherical, but also to that which has a rounded shape. There is no limit on the average particle size of the (C) component, but preferably it is between 0.01 and 200 μm, and, more preferably, between 0.01 and 150 μm, and, particularly preferably, between 0.01 and 100 μm.

Moreover, in the single-fluid curable thermally conductive silicone grease composition according to the present invention, the (C) component may be subjected to a surface treatment by an organic silicon compound or known surface treating agent, in order to improve the storage stability. The organic silicon compound may be, for example, an alkoxy silane such as methyltrimethoxysilane, vinyltrimethoxysilane, vinyltriethoxysilane, 3-glycidoxypropyltrimethoxysilane, 3-methacryloxypropyltrimethoxysilane, 3-aminopropyltrimethoxysilane, 3-aminopropyltriethoxysilane, N-(2-aminoethyl)-3-aminopropyltrimethoxysilane; a chlorosilane such as, for example, methyltrichlorosilane, dimethyldichlorosilane, trimethylmonochlorosilane, or the like; a silazane such as hexamethyldisilazane, hexamethylcyclotrisilazane, or the like; a siloxane oligomer such as a dimethylsiloxane oligomer blocked on both terminals of the molecular chain with silanol groups, an oligomer of a copolymer of methylvinylsiloxane and dimethylsiloxane blocked on both terminals of the molecular chain with silanol groups; methylvinylsiloxane oligomers blocked on both terminals of the molecular chain by silanol groups, or methylphenylsiloxane oligomers blocked on both terminals of the molecular chain with silanol groups. As other surface treating agents there are, for example, organic metal compounds, organic metallic complexes, fluorine-based organic compounds, organic compounds having hydroxyl groups, carboxy groups, amino groups, and the like. The surface treating process may be, for example, a method wherein the thermally conductive particles and/or electrically conductive particles are mixed directly with the surface treating agent for processing (a dry processing method), a method wherein the surface treating agent is mixed together with an organic solvent such as toluene, methanol, heptane, or the like, and mixed also with the thermally conductive particles and/or electrically conductive particles for processing (a wet processing method), or a method wherein the thermally conductive particles and/or electrically conductive particles are mixed into a mixture of the (A) component and these surface treating agents, or these surface treating agents are mixed into a mixture of the (A) component and the thermally conductive particles and/or electrically conductive particles, to perform the surface treatment on the thermally conductive particles and/or electrically conductive particles (and in situ treatment method). Moreover, when carrying out the surface treatment on the thermally conductive particles and/or electrically conductive particles through these surface treating agents, preferably an organic metal compound such as organic titanium, or the like, and water, or the like, for example, is added in order to improve the treatment efficiency.

The inclusion proportion of the (C) component is in a range of between 400 and 5,000 parts by weight, in respect to 100 parts by weight of the (A) component, and preferably in a range of between 400 and 3,000 parts by weight, and, particularly preferably, in a range between 500 and 2,500 parts by weight. This is because if the inclusion proportion of the (C) component were less than the lower limit of the range set forth above, there would be a tendency for the thermal conductivity of the silicone composition produced to be inadequate, and, on the other hand, if in excess of the upper limit of the range described above, there would be a tendency for remarkably reduced ease of handling of the silicon composition.

(D) Component

The microparticle catalyst of the (D) component is a catalyst for promoting curing of the composition, and comprises a thermoplastic resin with a softening point between 40 and 200° C., wherein the platinum-based catalyst is included as platinum metal atoms at no less than 0.01 mass %. The average particle diameter is between 0.01 and 500 μm, and preferably is in a range between 0.1 and 50 μm, and particularly preferably between 0.1 and 10 μm. This is because manufacturing of the microparticle catalyst would be difficult if the average particle diameter were less than 0.01 μm, and, if greater than 500 μm, the microparticle catalyst would not disperse uniformly into the (A) component, causing the curability of the composition produced to be non-uniform. The structure of the (D) component may be, for example, a structure wherein the platinum-based catalyst is dissolved or dispersed into a thermoplastic resin, or a microcapsule structure wherein the platinum-based catalyst is encapsulated in a thermoplastic resin shell. The platinum-based catalyst may be, for example, a platinum ultra-powder, platinum black, platinum carried on a silica ultra-powder, platinum carried on an activated charcoal, chloroplatinic acid, platinum tetrachloride, an alcohol solution of chloroplatinic acid, a complex of platinum and an olefin, a complex of platinum and an alkenyl siloxane, such as divinyltetramethyldisiloxane, or the like, and a platinum divinyldisiloxane complex is preferred. In the inclusion proportion of the platinum-based catalyst in the (D) component, the amount of the platinum metal atoms is no less than 0.01 mass %. This is because if the inclusion proportion of the platinum-based catalyst were less than 0.01 mass % as platinum metal atoms, the microparticle catalyst made from the thermoplastic resin would not adequately promote curing. Moreover, the softening point of the thermoplastic resin is in a range between 40 and 200° C., and preferably in a range between 50 and 180° C., and more preferably in a range between 60 and 160° C. This is because there would be a remarkable reduction in storage stability at room temperature for the composition produced when using a microparticle catalyst comprising a thermoplastic resin wherein the softening point is less than 40° C., and there would be a remarkable reduction in the curability of the composition produced when using a microparticle catalyst comprising a thermoplastic resin wherein the softening point is in excess of 200° C. This thermoplastic resin may be a thermoplastic silicone resin, acryl resin, polycarbonate resin, polystyrene resin, methyl cellulose resin, polysilane resin, nylon resin, polyester resin, polypropylene resin, polyalkylene wax, or the like, that includes uses, as its main component, a siloxane unit expressed by the formula: $C_6H_5SiO_{3/2}$, or, conversely, a siloxane unit expressed by the formula $(C_6H_5)_2 SiO_{2/2}$, or a siloxane unit expressed by the formula $CH_3SiO_{3/2}$, a siloxane unit expressed by the formula $(CH_3)_2SiO_{2/2}$, a siloxane unit expressed by the formula $CH_3(CH_2=CH_2) SiO_{2/2}$, a siloxane unit expressed by the formula $CH_3(C_6H_5)SiO_{2/2}$. The softening point of the thermoplastic resin is found through observing, using a microscope, the state of softening of the resin on a hot plate that can sheet at a given temperature. Moreover, as one aspect of the present invention, preferably siloxane units are included in the resin to adjust the heat durability characteristics and the softening point.

The method for preparing the (D) component may be, for example, a gas-phase dry method wherein the mixture is granulated after uniformly mixing the platinum-based catalyst and the thermoplastic resin, a method that performs interface polymerization or in situ polymerization of the thermoplastic resin in the presence of a platinum-based catalyst, a method that performs coacervation in the presence of a platinum-based catalyst, an in-liquid drying method, or the like, where the gas-phase drying method and the in-liquid drying method are preferred due to the ability to prepare, with relative ease, microparticle catalysts with narrow particle diameter distributions. Because the platinum-based catalyst may be adhered to the surface of the microparticle catalyst prepared in this way, preferably the platinum-based catalyst is removed using a cleaning agent, to produce a thermally conductive silicone rubber composition that has superior storage stability. Preferably the cleaning agent is of a type that dissolves the platinum-based catalyst without dissolving the thermoplastic resin, and may be, for example, an alcohol such as methyl alcohol or ethyl alcohol, a siloxane oligomer such as hexamethyldisiloxane, or the like, and so forth.

The blending quantity of the (D) component is within a range of between 0.01 and 20 parts by weight, relative to 100 parts by weight of the (A) component, and preferably in a range of between 0.1 and 10 parts by weight, and particularly preferably in a range of between 1 and 10 parts by weight. This is because if the (D) component were less than 0.01 parts by weight, in respect to 100 parts by weight of the (A) component, there would be a remarkable reduction in the curability of the composition produced, and if in excess of 20 parts by weight, this would be uneconomical, without further improving the curability.

(E) Component

The (E) component is a curing control agent (that is, an agent for controlling the hydrosilylizing reaction) in order to improve the ease of handling. This type of (E) component may be, for example, an acetylene-based compound such as 2-methyl-3-butyn-2-ol, 3,5-dimethyl-1-hexyn-3-ol, 2-phenyl-3-butyn-2-ol, 1-ethynylcyclohexanol, or the like; an enyne compound such as 3-methyl-3-penten-1-yne, 3,5-dimethyl-3-hexene-1-yne, or the like; a triazole such as 1,3,5,7-tetramethyl-1,3,5,7-tetravinylcyclotetrasiloxane, 1,3,5,7-tetramethyl-1,3,5,7-tetrahexenyl cyclototrasiloxane, benzotriazole, or the like; a phosphine, a mercaptan, a hydrazine, or the like. The inclusion proportions of these curing control agents will depend on the securing requirements for the composition. For example, it is in a range of between 0.001 and 5 parts by weight relative to 100 parts by weight of the organopolysiloxane of the (A) component, and preferably in a range between 0.01 and 3 parts by weight, and particularly preferably in a range of between 0.1 and 2 parts by weight. This is because if the (E) component were less than the lower limit of the range set forth above, there would be a tendency for the composition to cure inside of the heated coating nozzle, making discharging thereof difficult, where if the (E) component were in excess of the upper limit of the range set forth above, there would be a tendency for the curing to take unnecessarily long.

(F) Component

The single-fluid curable thermally conductive silicone grease composition according to the present invention may include the hydrolyzable organopolysiloxane compound expressed by (F-1), and/or the hydrolyzable organosilane compound expressed by (F-2), described below.

The hydrolyzable organopolysiloxane compound of the (F-1) component and the hydrolyzable organosilane compound expressed by (F-2) exhibit the effect of treating the surfaces of the thermally conductive filler. Moreover, they may exhibit the effect of improving the filling performance of the filler, and the effect of suppressing precipitation/separation of the filler in room-temperature storage performance.

[(F-1) Component]

The (F-1) component is an organopolysiloxane expressed by general formula (1), below:

[Chemical Formula 1]

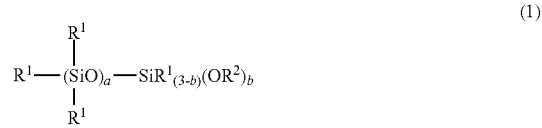

(wherein, $R^1$ is each independently a non-substituted or substituted monofunctional hydrocarbon group, $R^2$ is each independently a hydrogen atom, an alkyl group, an alkoxyalkyl group, an alkenyl group, or an acyl group, a is an integer between 5 and 250, and b is an integer between 1 and 3), with a viscosity between 10 and 10,000 mPa·s at 25° C.

$R^1$, above, is each independently a non-substituted or substituted monofunctional hydrocarbon group, and may be a linear alkyl group, a branched alkyl group, a cyclic alkyl group, an alkenyl group, an aryl group, an aralkyl group, a halogenated alkyl group, or the like. The linear alkyl group may be, for example, a methyl group, an ethyl group, a propyl group, a hexyl group, an octyl group, or the like. The branched alkyl group may be, for example, an isopropyl group, an isobutyl group, a tert-butyl group, a 2-ethylhexyl group, or the like. The cyclic alkyl group may be, for example, a cyclopentyl group, a cyclohexyl group, or the like. The alkenyl group may be, for example, a vinyl group, an allyl group, or the like. The aryl group may be, for example, a phenyl group, a tolyl group, or the like. The aralkyl group may be, for example, a 2-phenylethyl group, a 2-methyl-2-phenylethyl group, or the like. The halogenated alkyl group may be, for example, a 3,3,3-trifluoropropyl group, a 2-(nanofluorobutyl) ethyl group, a 2-(heptadecafluorooctyl) ethyl group, or the like. $R^1$ preferably is a methyl group or a phenyl group.

Each $R^2$ is, independently, a hydrogen atom, an alkyl group, an alkoxyalkyl group, an alkenyl group, or in acyl group. The alkyl group may be, for example, a linear alkyl group, a branched alkyl group, or a cyclic alkyl group, the same as given as examples for $R^1$. The alkoxyalkyl group may be, for example, a methoxyethyl group, or a methoxypropyl group. The acyl group may be, for example, an acetyl group, octanoyl group, or the like. $R^2$ preferably is an alkyl group, and, particularly preferably, a methyl group or an ethyl group.

a is an integer between 5 and 250, but preferably is between 5 and 200, and more preferably is an integer between 5 and 150. Moreover, b is an integer between 1 and 3.

Specific ideal examples of the (F-1) component include:
the dimethylpolysiloxane expressed by the formula:

[Chemical Formula 2]

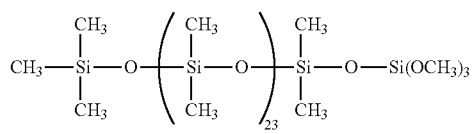

the dimethylpolysiloxane expressed by the formula:

[Chemical Formula 3]

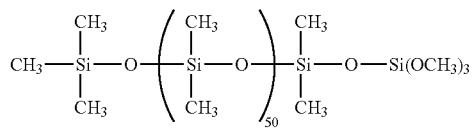

the dimethylpolysiloxane expressed by the formula:

[Chemical Formula 4]

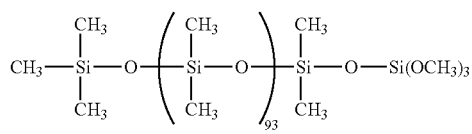

copolymers of methylphenylsiloxanes and dimethylpolysiloxanes expressed by the formula:

[Chemical Formula 5]

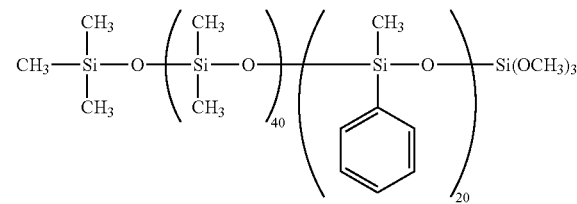

copolymers of diphenylsiloxane and dimethylpolysiloxane expressed by the formula:

[Chemical Formula 6]

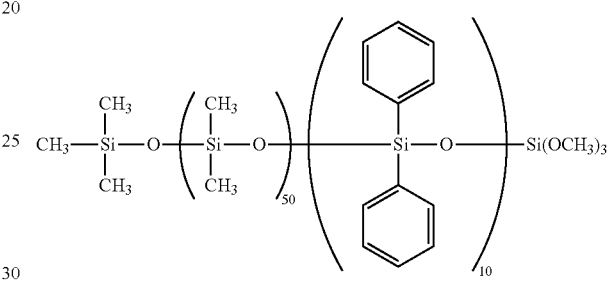

and the like.

[(F-2) Component]

The (F-2) component is an alkoxysilane expressed by general formula (2), below:

$$R^3_c R^4_d Si(OR^5)_{4-c-d} \qquad (2)$$

(wherein $R^3$ is each, independently, an alkyl group with a carbon number between 6 and 15, $R^4$ is each, independently, a non-substituted or substituted monofunctional hydrocarbon group with a carbon number between 1 and 8, $R^5$ is each, independently, an alkyl group with a carbon number between 1 and 6, c is an integer between 1 and 3, and d is an integer between 0 and 2, wherein c+d is an integer between 1 and 3).

Specific examples of $R^3$ include hexyl groups, octyl groups, nonyl groups, decyl groups, dodecyl groups, tetradecyl groups, pentadecyl groups, and the like. If the carbon number is less than 6, there would be a tendency for the wettability with the thermally conductive filling agent (the (C) component) to be inadequate, and if greater than 15, there would be a tendency for the (F-2) component to solidify at room temperature, which would tend to be inconvenient in handling, and would tend to reduce the thermal curability of the composition produced.

$R^4$ is each, independently, a non-substituted or substituted saturated or unsaturated monofunctional hydrocarbon group with a carbon number between 1 and 8, and specific examples thereof include alkyl groups such as methyl groups, ethyl groups, propyl groups, hexyl groups, octyl groups, and the like; cycloalkyl groups such as cyclopentyl groups, cyclohexyl groups, and the like; alkenyl groups such as vinyl groups, allyl groups, and the like; aryl groups such as phenyl groups, tolyl groups, and the like; aralkyl groups such as 2-phenylethyl groups, 2-methyl-2-phenylethyl groups, and the like; and hydrogenated hydrocarbon groups such as 3,3,3-trifluoropropyl groups, 2-(nanofluorobutyl)

ethyl groups, p-chlorophenyl groups, and the like, where methyl groups and ethyl groups are particularly preferred.

$R^5$ is each, independently, an alkyl group with a carbon number between 1 and 6, and specific examples include methyl groups, ethyl groups, propyl groups, butyl groups, pentyl groups, hexyl groups, and the like, where methyl groups and ethyl groups are particularly preferred.

c is normally an integer between 1 and 3, but 1 is particularly preferred. d is an integer between 0 and 2. However c+d is an integer between 1 and 3.

Specific ideal examples of the (F-2) component include, for example:

$C_8H_{17}Si(OCH_3)_3$,
$C_{10}H_{21}Si(OCH_3)_3$,
$C_{12}H_{25}Si(OCH_3)_3$,
$C_{10}H_{21}Si(CH_3)(OCH_3)_2$,
$C_{10}H_{21}Si(C_6H_5)(OCH_3)_2$,
$C_{10}H_{21}Si(CH_3)(OC_2H_5)_2$,
$C_{10}H_{21}Si(CH=CH_2)(OCH_3)_2$,
$C_{10}H_{21}Si(CH_2CH_2CF_3)(OCH_3)_2$,
and the like.

The inclusion proportion of the (F) component is in the range of between 0.05 and 20 parts by weight, in respect to 100 parts by weight of the (C) component, and preferably is in a range of between 0.05 and 10 parts by weight, more preferably in a range between 0.1 and 10 parts by weight, and particularly preferably in a range between 0.1 and 5 parts by weight. This is because if the inclusion proportion of the (F) component were less than the lower limit of the range set forth above, the fluidity of the silicone composition produced would be reduced when a large amount of the (C) component is included, and there be a tendency for the (C) component to precipitate and separate during storage of the silicone composition produced, while, on the other hand, if in excess of the upper limit of the range set forth above, there would be a tendency for poorer physical characteristics in the silicone composition produced.

(G) Component

The single-fluid curable thermally conductive silicone grease composition according to the present invention may include a silica ultra-powder as a (G) component. The silica ultra-powder of the (G) component is a component to reduce the tendency of the composition to slip and fall out when stored vertically after coating. The (G) component may be, for example, a silica ultra-powder such as fumed silica, precipitated silica, or the like, or a silica ultra-powder wherein the surfaces of these silica ultra-powders have been subjected to a hydrophobizing process through an organic silicone compound such as an alkoxysilane, a chlorosilane, a silazane, or the like. There is no particular limitation on the particle diameter of the (G) component, but a BET specific surface area of no less than 50 $m^2/g$ is preferred, and no less than 100 $m^2/g$ is particularly preferred.

The inclusion proportion of the (G) component is in a range of between 0.1 and 10 parts by weight, in respect to 100 parts by weight of the (A) component, and preferably is in a range of between 0.5 and 10 parts by weight. This is because if the inclusion proportion of the (G) component were less than the lower limit of the range set forth above, there would be a tendency for the silicone composition produced to slip and fall out when stored vertically after coating, while, on the other hand, if in excess of the upper limit of the range set forth above, there would be a tendency for remarkably poorer ease in handling of the silicone composition produced.

Moreover, as other arbitrary components, pigments, dyes, fluorescent dyes, heat-durable additives, flame retardation providing additives, plasticizing agents, and adhesion providing agents may be added to the present composition, insofar as they do not interfere with the object of the present invention. Moreover, polymers not having reactive groups on the terminals thereof, or polymers having condensation reaction activity, may be included in order to adjust the viscosity or thixotropy. Examples thereof include polydimethylsiloxanes with both terminals blocked by trimethylsiloxy groups, polydimethylsiloxanes with both terminals blocked by dimethylhydroxyl groups and polydimethylsiloxanes with both terminals blocked by trimethoxy groups.

The single-fluid curable thermally conductive silicone grease composition according to the present invention, and the other arbitrary components, may be manufactured through mixing uniformly. A conventional known method may be used, without any particular limitation, for the method for mixing the individual components of the organopolysiloxane composition, but normally simple stirring will produce a uniform mixture. Moreover, when solid components, such as inorganic filling agents, or the like, are used as arbitrary components, preferably mixing is through a mixing device. There is no particular limitation on the mixing device, and it may be a single-screw or double-screw continuous mixer, a double roller, a Ross mixer, a Hobart mixer, a dental mixer, a planetary mixer, a kneader mixer, a Henschel mixer, or the like.

The single-fluid curable thermally conductive silicone grease composition according to the present invention can be used suitably for dissipating heat, through thermal conduction from a heat-producing member to a cooling member through interposition between an electronic component, such as a transistor, an IC, a memory element, or the like, or another heat generating member, and a cooling member. Preferably the single-fluid curable thermally conductive silicone grease composition according to the present invention is coated in a state wherein a portion of a coating nozzle is heated in advance. Doing so enables the single-fluid curable thermally conductive silicone grease composition according to the present invention to undergo a gradual cross-linking reaction even at room temperature, enabling use as a heat dissipating material with superior reliability even in a harsh thermal environment. When coating the silicone composition according the present environment, there is no particular limitation on the heating parameter insofar as it is no less than on the softening point of the (D) composition, but normally it is between 80 and 200° C., and preferably between 100 and 180° C., for between 1 second and 30 minutes, and preferably between 10 seconds and 5 minutes. If less than the lower limit of the range set forth above, the thermoplastic resin would not melt completely and would not cure, and thus it would be necessary to melt the (D) component, and to cure to the prescribed viscosity, by heating the electronic device after coating. Moreover, if in excess of the upper limit of the range set forth above, there would be a tendency for thickening and for a cross-linking reaction within the nozzle, which would have a negative effect on the ease of operations. Moreover, the single-fluid curable thermally conductive silicone grease composition according to the present invention may be coated without heating the coating nozzle, and caused to undergo the cross-linking reaction through producing heat from a heat generating member such as an electronic component.

In the single-fluid curable thermally conductive silicone grease composition according to the present invention, preferably the complex modulus of elasticity after the cross-linking reaction, in a temperature range between −40° C. and 150° C., is in a range between 0.01 MPa and 20 MPa, and preferably between 0.05 MPa and 10 MPa, and more preferably between 0.05 and 5 MPa. In used stored vertically under harsh temperature conditions, if less than the lower limit of the range set forth above, there would be a tendency for the material to be pumped out, or for cracks to occur, and if in excess of the upper limit of the range set forth above, there would be a tendency for the single-fluid curable thermally conductive silicone grease composition to slip and fall out.

Because the single-fluid curable thermally conductive silicone grease composition according the present invention has high thermal conductivity and low-viscosity at room temperature, it has superior ease in handling, and can be used suitably as a heat dissipating material for a control unit for an automobile, due to its superior reliability in harsh environments after heated coating.

In the single-fluid curable thermally conductive silicone grease composition according the present invention, preferably the viscosity, measured at 25° C., is between 3.0 and 1,000 Pa·s, and more preferably between 10 and 500 Pa·s, and particularly preferably between 50 Pa s and 300 Pa·s. If the viscosity were less than 3.0 Pa·s, there would be the risk of poor ease of operations, such as difficulties in maintaining a shape. Moreover, if the viscosity were in excess of 1,000 Pa·s, there would also be the risk of problems in ease of operations, such as difficulties in discharging and coating. The viscosity described above can be obtained through adjusting the mixture of the various components described above. In the present invention, the "viscosity" is the value, at 25° C., measured using a rheometer (AR2000EX), manufactured by TA instruments. (The geometry is a parallel plate with a diameter of 20 mm, a gap of 0.5 mm, and the shear rate of 10.0 [1/s]).

An electronic device according to the present invention will be explained next using FIG. 1. In the electronic device according to the present invention, an electronic component 1 is mounted on a circuit board 2, to connect a circuit on the circuit board 2 and an external lead 3 of the electronic component 1 electrically. Via (VIA) holes are formed in the circuit board 2 in order to conduct efficiently heat that is produced by the electronic component 1. The electronic device according to the present invention is structured so as to dissipate, by a heat dissipating member 5, through the single-fluid curable thermally conductive silicone grease composition 4, heat that is generated by the electronic component 1. While there is no particular limitation on the thickness of the single-fluid curable thermally conductive silicone grease composition, preferably it is in a range between 0.1 and 3 mm. In particular, as depicted in FIG. 1, even when the single-fluid curable thermally conductive silicone grease composition is used under harsh temperature conditions in a state wherein it is held vertically between the circuit board 3 and a heat dissipating member 5, the single-fluid curable thermally conductive silicone grease composition will not slip and fall out, will not be pumped out, and voids and cracks will not be produced, and thus it has the distinctive feature of superior reliability.

EMBODIMENTS

The single-fluid curable thermally conductive silicone grease composition, the method for applying the single-fluid curable thermally conductive silicone grease, and the electronic device having the same, in the present invention, will be explained in detail the using embodiments.

The viscosity, thermal conductivity, thermal shock reliability, complex modulus of elasticity, and room temperature storage performance of the single-fluid curable thermally conductive silicone grease composition were measured as follows.

[Viscosity]

The initial viscosity (Pa·s) of the single-fluid curable thermally conductive silicone grease composition at 25° C. was measured using a rheometer (AR2000EX), manufactured by TA Instruments. The measurement was performed using a geometry of a parallel plate with a diameter of 20 mm, with a gap of 0.5 mm, under conditions of a sheer rate of 10.0 (1/s). The ratio of the viscosity that a shear rate of 1.0 in respect to a viscosity of a sheer rate of 10.0 is given as the thixotropy ratio. The viscosity was measured, using the same equipment, at a shear rate of 10.0 after resting for one hour at room temperature after heating for five minutes at 120° C.

[Complex Modulus of Elasticity]

Similar to the viscosity measurement, the complex modulus of elasticity was measured using a rheometer (MCR102), manufactured by Anton-Paar, for the composition after the single-fluid curable thermally conductive silicone grease composition was allowed to rest for one week at room temperature (25° C.) after heating for five minutes at 120° C. The geometry used a parallel plate with a diameter of 20 mm, with a gap of 1.0 mm, with a strain of 1% and a frequency of 1 Hz. The complex modulus of elasticity was measured first at −40° C., following which it was measured after increasing the temperature to 25° C. Finally, the temperature was increased to 150° C., and a measurement was performed.

[Thermal Conductivity]

As with the measurement of the complex modulus of elasticity, after the single-fluid curable thermally conductive silicone grease composition was heated for five minutes to 120° C., the composition was allowed to rest for one week at room temperature, and filled into a 60 mm×150 mm×25 mm container, and, after degassing, the surface thereof was coated with a polyvinylidene chloride film with a thickness of 10 μm, after which the thermal conductivity (W/mK) through this film was measured using a rapid thermal conductivity measuring device (heat ray method), manufactured by Kyoto Electronics Manufacturing Co., Ltd.

[Thermal Shock Reliability]

The thermal shock reliability of the single-fluid curable thermally conductive silicone grease composition was evaluated through the test method shown in FIG. 2 and FIG. 3. That is, after the single-fluid curable thermally conductive silicone grease composition was heated for five minutes at 120° C. within a heating nozzle, a prescribed amount of the composition 7 was coated onto a copper plate 6, after which spacers 8, with a thickness of 0.5 mm or 2.0 mm, were placed near both end portions of the copper plate, and, in this state, the single-fluid curable thermally conductive silicone grease composition was held between the copper plate and a glass plate 9, so as to have a diameter of 2 cm. Thereafter, the copper plate 6 and the glass plate 9 were secured together by a clip 10, to manufacture a test body. The test body was subjected to 200 cycles of thermal shock testing, with one cycle being −40° C. for 30 minutes followed by 150° C. for 30 minutes as a single cycle, in a state wherein the test body was placed standing with the surface of the copper plate that contacts the single-fluid curable thermally conductive silicone grease composition being vertical, and the distance by which the single-fluid curable thermally conductive silicone grease composition slipped out was measured. If the distance slipped was less than 1 mm, this was defined as "⊚," with "○" for between 1 and 3 mm, and "X" if more than 5 mm. Moreover, the external appearance of the single-fluid curable thermally conductive silicone grease composition after testing was observed, and if no pump-out or cracking occurred, the evaluation was "None," but if it occurred, this was evaluated as "Present."

[Storage Performance in Room-Temperature Storage]

The single-fluid curable thermally conductive silicone grease composition was placed in a glass container and sealed and stored at 25° C., and the number of days until the viscosity doubled in relation to the initial value was measured.

In Table 1, the various components used were as follows. Note that the viscosity was the value measured at 25° C. by a rotary viscosimeter.

First the various components below for preparing the single-fluid curable thermally conductive silicone grease composition according to the present invention were prepared.

(A) Component

A-1: Inclusion proportion of Si-Vi, with a viscosity of 400 mPa·s at 25° C., with both terminals blocked with dimethylvinylsilyl groups: 0.44 mass %.

A-2: Inclusion ratios of Siloxane units expressed by the formula $(CH_3)_2SiO_{2/2}$: 95 mol %, siloxane units expressed by the formula $CH_3SiO_{3/2}$: 2.4 mol %, siloxane units expressed by the formula $(CH_3)_3SiO_{1/2}$: 2.0 mol %, siloxane units expressed by the formula $(CH_3)_2(CH_2=CH)SiO_{1/2}$: 0.6 mol %, Si Vi inclusion proportion of organopolysiloxane with a viscosity of 350 mPa·s at 25° C.: 0.22 mass %

A-3: Si-Vi inclusion proportion of dimethylpolysiloxane wherein the viscosity at 25° C. is 40,000 mPa·s, blocked at both terminals with dimethylvinylsilyl groups: 0.08 mass %

(B) Component

B-1: Si—H inclusion proportion of the hydrogen polysiloxane expressed by the average formula, below

[Chemical Formula 7]

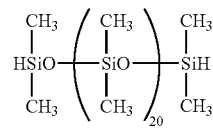

is 0.15 mass %, 25 mPa·s.

B-2: Si—H inclusion proportion of the hydrogen polysiloxane expressed by the average formula, below

[Chemical Formula 8]

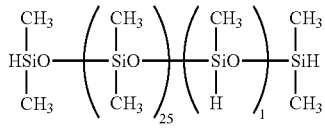

is 0.10 mass %, 20 mPa·s.

B-3: Si—H inclusion proportion of the hydrogen polysiloxane expressed by the average formula, below

[Chemical Formula 9]

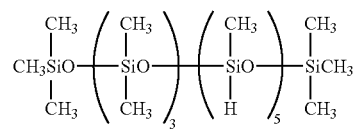

is 0.12 mass %, 15 mPa·s.

B-4: Si—H inclusion proportion of the hydrogen polysiloxane expressed by the average formula, below

[Chemical Formula 10]

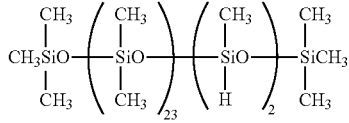

is 0.73 mass %, 5 mPa·s.

(C) Component

C-1: Zinc oxide ultra-powder with an average particle diameter of 0.12 μm

C-2: Crushed alumina ultra-powder with an average particle diameter of 0.4 μm

C-3: Crushed alumina ultra-powder with an average particle diameter of 1.2 μm

C-4: Spherical alumina ultra-powder with an average particle diameter of 4.0 μm.

C-5: Rounded alumina ultra-powder with an average particle diameter of 20 μm

C-6: Spherical alumina ultra-powder with an average particle diameter of 35 μm (D) Component D-1: A microparticle catalyst with an average particle diameter of 1.5 μm, comprising a methylmethacrylate-butylmethacrylate copolymer (Elvacite 2013, manufactured by DuPont Corporation), with a softening point of 115° C., and wherein a platinum complex 1,3-divinyltetramethyldisiloxane is included at 0.4 mass %, as platinum metal atoms D-2: A microparticle catalyst with an average particle diameter of 1.2 μm, comprising a thermoplastic silicone resin with a softening point of 85° C., expressed by $((C_6H_5)SiO_{3/2})_{0.78}((CH_3)_3SiO_{1/2})_{0.22}$, including a platinum complex 1,3-divinyltetramethyldisiloxane at 0.4 mass % as platinum metal atoms (E) Component E-1: Tris (1,1-dimethylpropenoxy) methylsilane E-2: 1-ethynyl-1-cyclohexanol (F) Component F-1: Polyorganosiloxane expressed by the following formula

[Chemical Formula 11]

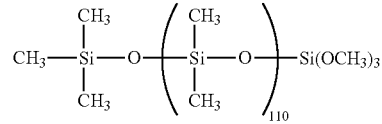

F-2: An alkyl silane expressed by $C_{10}H_{21}Si(OCH_3)_3$

Other Components (G) Component

G: Fumed silica with a BET specific surface area of 200 m²/g, subjected to a hydrophobizing process using hexamethyldisilazane (H) Component H: A solution wherein a platinum complex 1,3-divinyltetramethyldisiloxane was dissolved in the same dimethylpolysiloxane as in the A-1 (0.4 mass % for the platinum metal atoms)

Component

I: Methyl trimethoxy silane

[Embodiments 1 Through 6], [Reference Examples 4, 5]

The components (A) through (E), and the other components were mixed together, using the methods described above, following the blending quantities shown in Table 1, below, to prepare single-fluid curable thermally conductive silicone grease compositions. Note that the Si—H/Si-Vi (count ratio) in Table 1 is the ratio of the total number of SiH groups in the (B) component to the total number of alkenyl groups in the (A) component. After (A), (C), (F), (G), (I) were mixed in a Ross mixer, heating and stirring was performed for one hour at 150° C. under vacuum. The mixture was then cooled to 25° C., and returned to atmospheric pressure. Following this, (B) and (E) were added, and after securing, finally the (D) component was added, and the material was mixed until uniform, to prepare the single-fluid curable thermally conductive silicone grease composition. The characteristics of the single-fluid curable thermally conductive silicone grease composition, and the cured material thereof, that were measured, and the results are given in Table 1.

Reference Example 1

A single-fluid curable thermally conductive silicone grease composition was prepared by mixing all of the components in the same manner as in Embodiment 1, except for not including the (D) component.

Reference Example 2

A single-fluid curable thermally conductive silicone grease composition was prepared by mixing the (H) component instead of the (D) component in Embodiment 1.

Reference Example 3

A single-fluid curable thermally conductive silicone grease composition was prepared by mixing the same way as in Embodiment 1, except for not including the (E) component.

In all of Reference Examples 1 through 3 as well, the characteristics of the single-fluid curable thermally conductive silicone grease compositions and the cured materials thereof were measured in the same way, and the results are given in Table 1.

TABLE 1

| Units: Parts by Weight | Embodiments | | | | | | Reference Examples | | | | |
|---|---|---|---|---|---|---|---|---|---|---|---|
| No. | 1 | 2 | 3 | 4 | 5 | 6 | 1 | 2 | 3 | 4 | 5 |
| A-1 | 100 | 75 | 100 | 20 | 100 | 100 | 100 | 100 | 100 | 100 | 100 |
| A-2 | | | | 80 | | | | | | | |
| A-3 | | 25 | | | | | | | | | |
| B-1 | 8.8 | | 295 | | 88 | 8.8 | 8.8 | 8.8 | 8.8 | 8.8 | |
| B-2 | | 13.1 | | | | | | | | | |
| B-3 | | | | 11.0 | | | | | | | |
| B-4 | | | | | | | | | | | 8.8 |
| Si-H/Si-Vi (Count Ratio) | 0.8 | 1.0 | 2.7 | 1.4 | 08 | 0.8 | 0.8 | 0.8 | 0.8 | 0.8 | 3.9 |
| C-1 | 300 | | 300 | 300 | 300 | 300 | 300 | 300 | 300 | 300 | 300 |
| C-2 | | 190 | | | | | | | | | |
| C-3 | 760 | | 760 | 760 | 760 | 760 | 760 | 760 | 760 | 760 | 760 |
| C-4 | | 210 | | | | | | | | | |
| C-5 | 720 | | 720 | 720 | 720 | 720 | 720 | 720 | 720 | 720 | 720 |
| C-6 | | 510 | | | | | | | | | |
| D-1 | 3.5 | 3.5 | 35 | 3.5 | | 3.5 | | | 3.5 | 3.5 | 3.5 |
| D-2 | | | | | 35 | | | | | | |
| E-1 | 1.7 | 1.7 | 1.7 | 1.7 | | 0.2 | 1.7 | 1.7 | | 6.0 | 1.7 |
| E-2 | | | | | 12 | | | | | | |
| F-1 | 25 | | 25 | 25 | 25 | 25 | 25 | 25 | 25 | 25 | 25 |
| F-2 | | 2.8 | | | | | | | | | |
| G | 3.2 | 4.2 | 32 | 3.2 | 32 | 3.2 | 3.2 | 3.2 | 3.2 | 3.2 | 3.2 |
| H | | | | | | | | 3.5 | | | |
| I | 5.0 | | 5.0 | 5.0 | 5.0 | 5.0 | 5.0 | 5.0 | 5.0 | 5.0 | 5.0 |
| Initial Viscosity (Pa · s) | 180 | 190 | 150 | 250 | 180 | 170 | 200 | 170 | 180 | 180 | 170 |
| Thixotropy Ratio | 2.4 | 3.9 | 2.4 | 4.2 | 2.4 | 2.3 | 2.2 | 2.2 | 2.3 | 2.4 | 2.0 |

TABLE 1-continued

| Units: Parts by Weight | Embodiments | | | | | | Reference Examples | | | | |
|---|---|---|---|---|---|---|---|---|---|---|---|
| No. | 1 | 2 | 3 | 4 | 5 | 6 | 1 | 2 | 3 | 4 | 5 |
| Viscosity (Pa·s) after 120° C./5 Minutes Heating + Resting at Room Temperature for One Hour | 190 | 190 | 180 | 280 | 180 | 450 | 200 | >2000 | 1500 | 190 | 200 |
| Complex Modulus of Elasticity (MPa) −40° C. | 0.04 | 0.30 | 15 | 0.70 | 0.05 | 0.05 | 0.02 | 0.04 | 0.04 | 0.01 | 64 |
| Complex Modulus of Elasticity (MPa) 25° C. | 0.02 | 0.15 | 8 | 0.06 | 0.06 | 0.02 | 0.005 | 0.02 | 0.02 | 0.004 | 18 |
| Complex Modulus of Elasticity (MPa) 150° C. | 0.03 | 0.07 | 6 | 0.04 | 0.06 | 0.06 | 0.003 | 0.04 | 0.02 | 0.003 | 10 |
| Thermal Conductivity (W/mK) | 3.0 | 2.6 | 3.0 | 3.1 | 3.0 | 3.0 | 3.1 | 3.0 | 3.0 | 3.0 | 3.0 |
| Thermal Shock Reliability (Thickness: 2 mm) | | | | | | | | | | | |
| Vertical Slip Performance (mm) | ◎ | ◎ | ○ | ◎ | ◎ | ◎ | X | ◎ | ○ | X | X |
| Pump-out | None | None | None | None | None | None | Present | None | None | Present | None |
| Cracking | None | None | None | None | None | None | None | None | None | None | None |
| Thermal Shock Reliability (Thickness: 2 mm) | | | | | | | | | | | |
| Vertical Slip Performance (mm) | ◎ | ◎ | ◎ | ◎ | ◎ | ◎ | X | ◎ | ○ | X | X |
| Pump-out | None | None | None | None | None | None | Present | None | None | Present | None |
| Cracking | None | None | None | None | None | None | None | None | None | None | None |
| Room-Temperature Storage Performance | More Than 12 Months | | | | 10 Months | More Than 12 Months | More Than 12 Months | 1 Month | 6 Months | More Than 12 Months | More Than 12 Months |

BRIEF DESCRIPTIONS OF THE DRAWINGS

Figure 1:
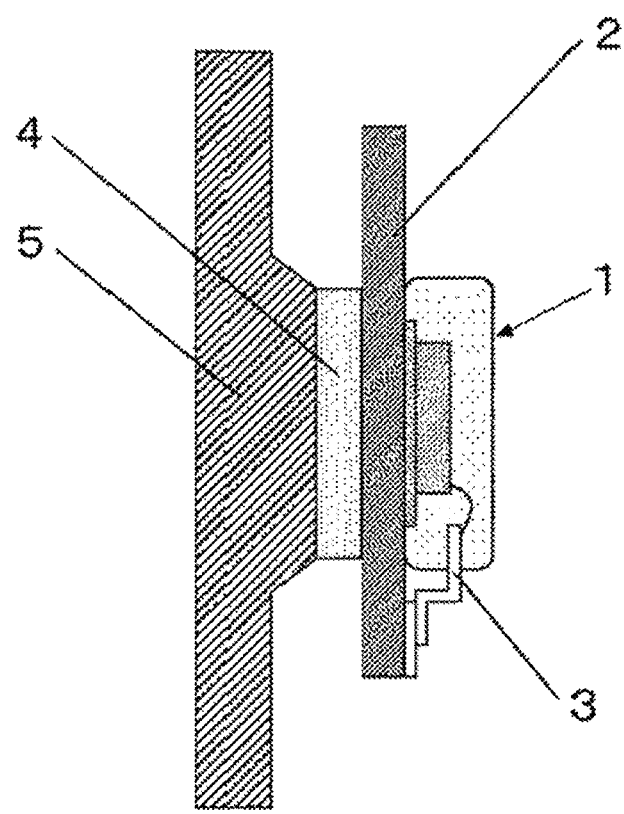
FIG. 1 is a cross-sectional drawing of an electronic device according to the present invention.
Figure 2:
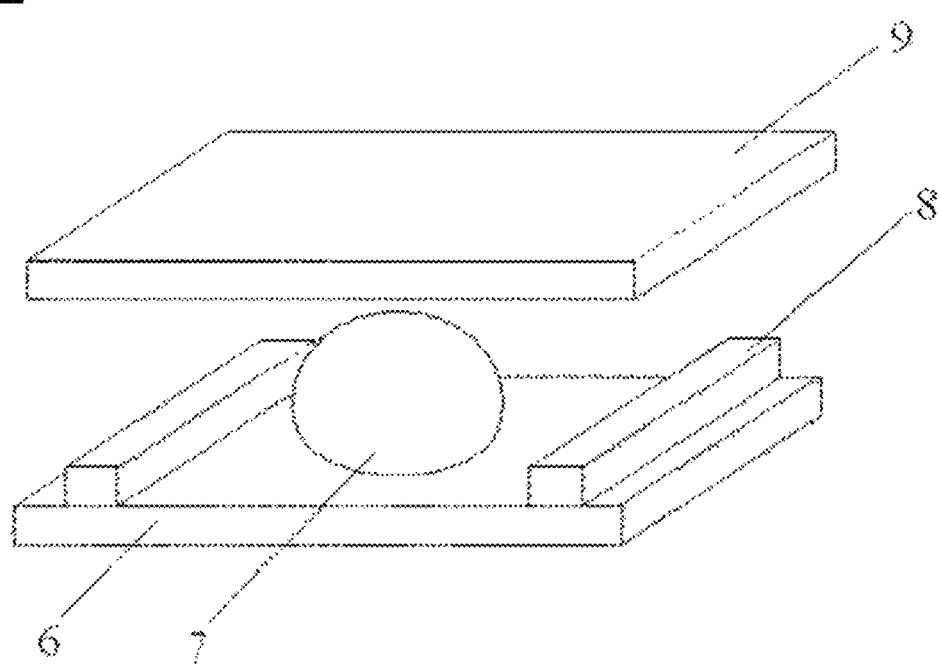
FIG. 2 is a conceptual diagram depicting the method for manufacturing the test body for evaluating the vertical storage performance.
Figure 3:
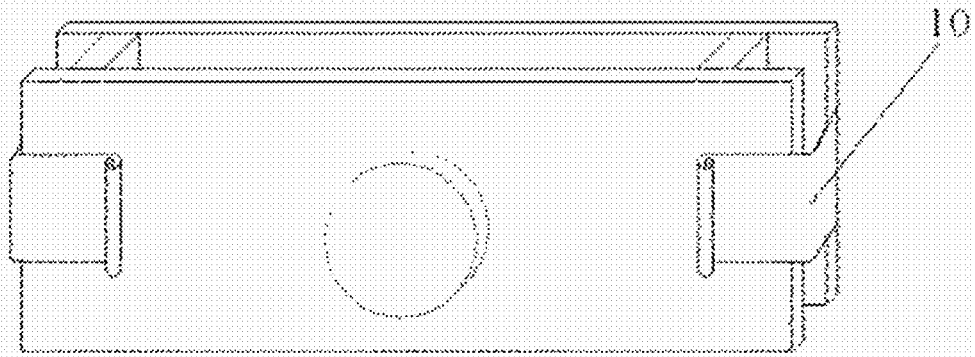
FIG. 3 is a perspective diagram of the test body for evaluating the vertical storage performance.
Figure 4:
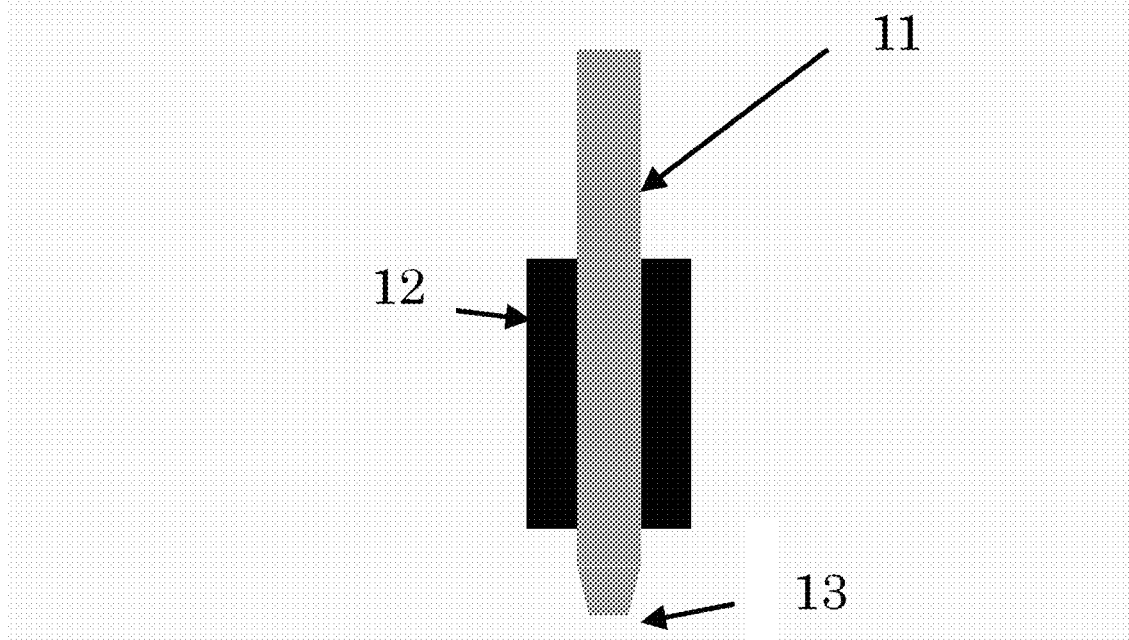
FIG. 4 is a cross-sectional conceptual diagram of a nozzle for heating and expelling.

1: Electronic Element
2: Circuit Board
3: External Lead
4: Thermally Curable Conductive Silicone Composition
5: Heat Dissipating Member
6: Copper Plate
7: Thermally Conductive Silicone Composition
8: Spacer
9: Glass Plate
10: Clip
11: Dispensing Nozzle
12: Nozzle Heating Unit
13: Nozzle Discharge Opening

POTENTIAL FOR USE IN INDUSTRY

The thermally conductive silicone grease composition according the present invention enables good long-term storage at room temperature and can be used even in the harsh thermal environments. Moreover, it can be used even at locations wherein the application surface is rough or at an incline. Coating this heat dissipating grease using the method according to the present invention enables easy, low cost, reliable curing, enabling reliable application of the heat dissipating member. Moreover, this enables semiconductors, electronic components, and electronic devices that use this heat dissipating grease to withstand even a high-temperature environments with high reliability, enabling use even in control units of, and the like, for automobiles.

The invention claimed is:

1. A method for applying a single-fluid curable thermally conductive silicone grease composition, wherein the single-fluid curable thermally conductive silicone grease composition comprises:
(A) 100 parts by weight organopolysiloxane, having an aliphatic unsaturated hydrocarbon group bonded to at least one silicon atom per single molecule, with a viscosity at 25° C. between 50 and 100,000 mPa·s;
(B) between 0.1 and 50 parts by weight of an organohydrogen siloxane that includes hydrogen atoms bonded to at least two silicon atoms per single molecule;
(C) between 400 and 5,000 parts by weight of a thermally conductive filler that includes particle diameters with an average particle diameter between 0.01 and 200 μm;
(D) between 0.01 and 20 parts by weight of a microparticle catalyst, with an average particle diameter of between 0.01 and 10 μm, comprising a thermoplastic resin with a softening point between 40° C. and 200° C., wherein a platinum-based catalyst is included at no less than 0.01 mass %, as platinum metal atoms; and
(E) between 0.001 and 5 parts by weight of a curing control agent;
wherein the complex modulus of elasticity after curing of the composition is between 0.01 MPa and 20 MPa at 25° C.; and
wherein the single-fluid curable thermally conductive silicone grease composition is filled into a nozzle that is capable of discharging, and after some or all of the nozzle has been heated to a temperature of no less than the softening point of the (D) component, the single-fluid curable thermally conductive silicone grease composition is coated through discharging from the nozzle.

2. The method as set forth in claim 1, wherein, in the (B) component, the organohydrogen siloxane includes, on average, no less than 0 and less than 3 hydrogen atoms bonded to non-terminal silicon atoms per single molecule.

3. The method as set forth in claim 1, wherein the single-fluid curable thermally conductive silicone grease composition further comprises:
(F1) a polyorganosiloxane or silane compound expressed by general formula (F1), below:

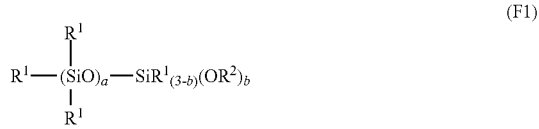

wherein, each $R^1$ is independently a non-substituted or substituted monofunctional hydrocarbon group, each $R^2$ is independently a hydrogen atom, an alkyl group, an alkoxyalkyl group, an alkenyl group, or an acyl group, a is an integer between 5 and 250, and b is an integer between 1 and 3, with a viscosity between 10 and 10,000 mPa·s at 25° C., at between 0.05 and 20 parts by weight with respect to 100 parts by weight of the (C) component; and/or
(F2) an alkoxy silane expressed by general formula (F-2), below:

$$R^3{}_c R^4{}_z Si(OR^5)_{4-c-} \qquad (F2)$$

wherein each $R^3$ is independently an alkyl group with a carbon number between 6 and 15, each $R^4$ is independently a non-substituted or substituted monofunctional hydrocarbon group with a carbon number between 1 and 8, each $R^5$ is independently an alkyl group with a carbon number between 1 and 6, c is an integer between 1 and 3, and d is an integer between 0 and 2, wherein c+d is an integer between 1 and 3, at between 0.05 and 20 parts by weight relative to 100 parts by weight of the (C) component.

4. The method as set forth in claim 3, wherein the single-fluid curable thermally conductive silicone grease composition further comprises:
(G) a silica ultra-powder at between 0.1 and 10 parts by weight.

5. The method as set forth in claim 1, wherein the single-fluid curable thermally conductive silicone grease composition further comprises:
(G) a silica ultra-powder at between 0.1 and 10 parts by weight.

6. A method for applying a single-fluid curable thermally conductive silicone grease composition, wherein the single-fluid curable thermally conductive silicone grease composition comprises:
(A) 100 parts by weight organopolysiloxane, having an aliphatic unsaturated hydrocarbon group bonded to at least one silicon atom per single molecule, with a viscosity at 25° C. between 50 and 100,000 mPa·s;
(B) an organohydrogen siloxane wherein an organohydrogen siloxane that includes hydrogen atoms bonded to at least two silicon atoms per single molecule includes, on average per single molecule, no less than zero and less than 3 hydrogen atoms bonded to non-terminal silicon atoms, in an amount wherein the number of hydrogen atom groups bonded to silicon atoms in the (B) component divided by the number of aliphatic unsaturated hydrocarbon groups in the (A) component is between 0.2 and 3.0;
(C) between 400 and 5,000 parts by weight of a thermally conductive filler that includes particle diameters with an average particle diameter between 0.01 and 200 μm;
(D) between 0.01 and 20 parts by weight of a microparticle catalyst, with an average particle diameter of between 0.01 and 10 μm, comprising a thermoplastic resin with a softening point between 40° C. and 200° C., wherein a platinum-based catalyst is included at no less than 0.01 mass %, as platinum metal atoms; and
(E) between 0.001 and 5 parts by weight of a curing control agent; and
wherein the single-fluid curable thermally conductive silicone grease composition is filled into a nozzle that is capable of discharging, and after some or all of the nozzle has been heated to a temperature of no less than the softening point of the (D) component, the single-fluid curable thermally conductive silicone grease composition is coated through discharging from the nozzle.

7. The method as set forth in claim 6, further comprising:
(G) a silica ultra-powder at between 0.1 and 10 parts by weight.

8. The method as set forth in claim 6, further comprising:
(F1) a polyorganosiloxane or silane compound expressed by general formula (F1), below:

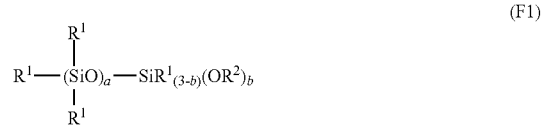

wherein, each $R^1$ is independently a non-substituted or substituted monofunctional hydrocarbon group, each $R^2$ is independently a hydrogen atom, an alkyl group, an alkoxyalkyl group, an alkenyl group, or an acyl group, a is an integer between 5 and 250, and b is an integer between 1 and 3, with a viscosity between 10 and 10,000 mPa·s at 25° C., at between 0.05 and 20 parts by weight with respect to 100 parts by weight of the (C) component; and/or (F2) an alkoxy silane expressed by general formula (F-2), below:

$$R^3_c R^4_z Si(OR^5)_{4-c-d} \quad (F2)$$

wherein each $R^3$ is independently an alkyl group with a carbon number between 6 and 15, each $R^4$ is independently a non-substituted or substituted monofunctional hydrocarbon group with a carbon number between 1 and 8, each $R^5$ is independently an alkyl group with a carbon number between 1 and 6, c is an integer between 1 and 3, and d is an integer between 0 and 2, wherein c+d is an integer between 1 and 3, at between 0.05 and 20 parts by weight relative to 100 parts by weight of the (C) component.

9. The method as set forth in claim 8, further comprising:
(G) a silica ultra-powder at between 0.1 and 10 parts by weight.

10. An electronic device, wherein:
a heat dissipating member is installed on an electronic component or on a circuit board whereon the electronic component is installed, having, therebetween, a cured material of a single-fluid curable thermally conductive silicone grease composition;
the cured material of the single-fluid curable thermally conductive silicone grease composition, having a thickness between 0.1 and 3 mm, is held, vertically, between the circuit board and the heat dissipating member;
the single-fluid curable thermally conductive silicone grease composition comprises:
(A) 100 parts by weight organopolysiloxane, having an aliphatic unsaturated hydrocarbon group bonded to at least one silicon atom per single molecule, with a viscosity at 25° C. between 50 and 100,000 mPa·s;
(B) between 0.1 and 50 parts by weight of an organohydrogen siloxane that includes hydrogen atoms bonded to at least two silicon atoms per single molecule;
(C) between 400 and 5,000 parts by weight of a thermally conductive filler that includes particle diameters with an average particle diameter between 0.01 and 200 μm;
(D) between 0.01 and 20 parts by weight of a microparticle catalyst, with an average particle diameter of between 0.01 and 10 μm, comprising a thermoplastic resin with a softening point between 40° C. and 200° C., wherein a platinum-based catalyst is included at no less than 0.01 mass %, as platinum metal atoms; and
(E) between 0.001 and 5 parts by weight of a curing control agent; and
the complex modulus of elasticity after curing of the composition is between 0.01 MPa and 20 MPa at 25° C.

11. The electronic device as set forth in claim 10, wherein, in the (B) component, the organohydrogen siloxane includes, on average, no less than 0 and less than 3 hydrogen atoms bonded to non-terminal silicon atoms per single molecule.

12. The electronic device as set forth in claim 10, wherein the single-fluid curable thermally conductive silicone grease composition further comprises:

(F1) a polyorganosiloxane or silane compound expressed by general formula (F1), below:

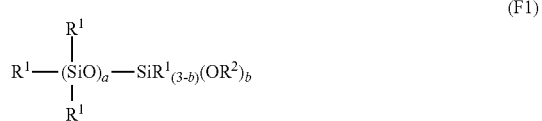

(F1)

wherein, each $R^1$ is independently a non-substituted or substituted monofunctional hydrocarbon group, each $R^2$ is independently a hydrogen atom, an alkyl group, an alkoxyalkyl group, an alkenyl group, or an acyl group, a is an integer between 5 and 250, and b is an integer between 1 and 3, with a viscosity between 10 and 10,000 mPa·s at 25° C., at between 0.05 and 20 parts by weight with respect to 100 parts by weight of the (C) component; and/or (F2) an alkoxy silane expressed by general formula (F-2), below:

$$R^3_c R^4_z Si(OR^5)_{4-c-d} \quad (F2)$$

wherein each $R^3$ is independently an alkyl group with a carbon number between 6 and 15, each $R^4$ is independently a non-substituted or substituted monofunctional hydrocarbon group with a carbon number between 1 and 8, each $R^5$ is independently an alkyl group with a carbon number between 1 and 6, c is an integer between 1 and 3, and d is an integer between 0 and 2, wherein c+d is an integer between 1 and 3, at between 0.05 and 20 parts by weight relative to 100 parts by weight of the (C) component.

13. The electronic device as set forth in claim 12, wherein the single-fluid curable thermally conductive silicone grease composition further comprises:
(G) a silica ultra-powder at between 0.1 and 10 parts by weight.

14. The electronic device as set forth in claim 10, wherein the single-fluid curable thermally conductive silicone grease composition further comprises:
(G) a silica ultra-powder at between 0.1 and 10 parts by weight.

15. An electronic device, wherein:
a heat dissipating member is installed on an electronic component or on a circuit board whereon the electronic component is installed, having, therebetween, a cured material of a single-fluid curable thermally conductive silicone grease composition;
the cured material of the single-fluid curable thermally conductive silicone grease composition, having a thickness between 0.1 and 3 mm, is held, vertically, between the circuit board and the heat dissipating member; and
the single-fluid curable thermally conductive silicone grease composition comprises:
(A) 100 parts by weight organopolysiloxane, having an aliphatic unsaturated hydrocarbon group bonded to at least one silicon atom per single molecule, with a viscosity at 25° C. between 50 and 100,000 mPa·s;
(B) an organohydrogen siloxane wherein an organohydrogen siloxane that includes hydrogen atoms bonded to at least two silicon atoms per single molecule includes, on average per single molecule, no less than zero and less than 3 hydrogen atoms bonded to non-terminal silicon atoms, in an amount wherein the number of hydrogen atom groups bonded to silicon atoms in the (B) component divided by the number of aliphatic unsaturated hydrocarbon groups in the (A) component is between 0.2 and 3.0;

(C) between 400 and 5,000 parts by weight of a thermally conductive filler that includes particle diameters with an average particle diameter between 0.01 and 200 μm;

(D) between 0.01 and 20 parts by weight of a microparticle catalyst, with an average particle diameter of between 0.01 and 10 μm, comprising a thermoplastic resin with a softening point between 40° C. and 200° C., wherein a platinum-based catalyst is included at no less than 0.01 mass %, as platinum metal atoms; and (E) between 0.001 and 5 parts by weight of a curing control agent.

16. The electronic device as set forth in claim 15, wherein the single-fluid curable thermally conductive silicone grease composition further comprises:

(F1) a polyorganosiloxane or silane compound expressed by general formula (F1), below:

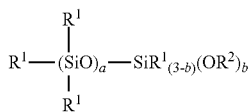 (F1)

wherein, each $R^1$ is independently a non-substituted or substituted monofunctional hydrocarbon group, each $R^2$ is independently a hydrogen atom, an alkyl group, an alkoxyalkyl group, an alkenyl group, or an acyl group, a is an integer between 5 and 250, and b is an integer between 1 and 3, with a viscosity between 10 and 10,000 mPa·s at 25° C., at between 0.05 and 20 parts by weight with respect to 100 parts by weight of the (C) component; and/or (F2) an alkoxy silane expressed by general formula (F-2), below:

$$R^3_c R^4_z Si(OR^5)_{4-c-d} \qquad (F2)$$

wherein each $R^3$ is independently an alkyl group with a carbon number between 6 and 15, each $R^4$ is independently a non-substituted or substituted monofunctional hydrocarbon group with a carbon number between 1 and 8, each $R^5$ is independently an alkyl group with a carbon number between 1 and 6, c is an integer between 1 and 3, and d is an integer between 0 and 2, wherein c+d is an integer between 1 and 3, at between 0.05 and 20 parts by weight relative to 100 parts by weight of the (C) component.

17. The electronic device as set forth in claim 16, wherein the single-fluid curable thermally conductive silicone grease composition further comprises:

(G) a silica ultra-powder at between 0.1 and 10 parts by weight.

18. The electronic device as set forth in claim 15, wherein the single-fluid curable thermally conductive silicone grease composition further comprises:

(G) a silica ultra-powder at between 0.1 and 10 parts by weight.

* * * * *